(12) United States Patent
Chen et al.

(10) Patent No.: US 6,429,091 B1
(45) Date of Patent: Aug. 6, 2002

(54) PATTERNED BURIED INSULATOR

(75) Inventors: Bomy A. Chen, Ridgefield, CT (US); Alexander Hirsch, Wappingers Falls, NY (US); Sundar K. Iyer, Beacon, NY (US); Nivo Rovedo, LaGrangeville, NY (US); Hsing-Jen Wann, Briarcliff Manor, NY (US); Ying Zhang, Yorktown Heights, NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 7 days.

(21) Appl. No.: 09/733,324

(22) Filed: Dec. 8, 2000

(51) Int. Cl.[7] ................................................ H01L 21/76
(52) U.S. Cl. ....................... 438/423; 438/407; 438/440; 438/520; 438/526; 257/506; 257/510
(58) Field of Search ................................. 438/423, 426, 438/407, 409, 440, 520, 526; 257/506, 510, 511

(56) References Cited

U.S. PATENT DOCUMENTS 5,963,817 A 10/1999 Chu et al. .................. 438/410
6,069,054 A * 5/2000 Choi .......................... 438/423

OTHER PUBLICATIONS

Sylvia S. Tsao, "Porous Silicon Techniques for SOI Structures", IEEE Circuits and Devices, Nov. 1987, pp 3–7.
Kathy Barla, et al., "SOI Technology Using Buried Layers of Oxidized Porous Si", IEEE Circuits and Devices, Nov. 1987, pp 11–15.
G. Bomchil, et al., "Porous silicon: The material and its applications to SOI technologies", Microelectronic Engineering 8 (1988), pp 293–310.
T. Skotnicki, et al., "Well–controlled, selectively under–etched Si/SiGe gates for RF and high performance CMOS", 2000 Symposium on VLSI Technology Digest of Technical Papers, pp 156–157.

* cited by examiner

Primary Examiner—Wael Fahmy
Assistant Examiner—Hsien-Ming Lee
(74) Attorney, Agent, or Firm—Eric W. Petraske; Ira D. Blecker

(57) ABSTRACT

A patterned buried insulator is formed beneath the source and drain by forming a mask over the body area and implanting a dose of n or p type ions in the areas where the source and drains will be formed, then etching the STI and etching out the implanted area. A light oxidation is followed by a conformal oxide deposition in the STI and also in the etched area, thereby forming the buried oxide only where desired.

11 Claims, 5 Drawing Sheets

PATTERNED BURIED INSULATOR

FIELD OF THE INVENTION

The field of the invention is that of forming integrated circuits with a buried insulator, e.g. oxide, that is formed in selected areas.

BACKGROUND OF THE INVENTION

The advantages of circuits with buried oxide are well known, as are the problems associated with having the transistor body isolated from the substrate and with the extra cost associated with the long time required to perform the implant.

Extensive work has gone into various schemes for forming body contacts to alleviate the problems, but they all have problems, usually excessive consumption of silicon area.

It has been suggested to implant the oxygen ions in a patterned fashion and subject the wafer to high temperature annealing, but that still has the extra cost associated with the high dose implant and isolation of defects and oxygen precipitates from the device area.

SUMMARY OF THE INVENTION

The invention relates to an integrated circuit having buried insulator formed only under the sources and drains of transistors.

A feature of the invention is the implantation of a dopant species at a dose two orders of magnitude less than is required for oxygen implantation.

Another feature of the invention is the selective etching of the implanted areas after or during the shallow trench etch.

Yet another feature of the invention is the deposition of oxide in the buried etched cavities.

DESCRIPTION OF THE PREFERRED EMBODIMENT

Figure 1:
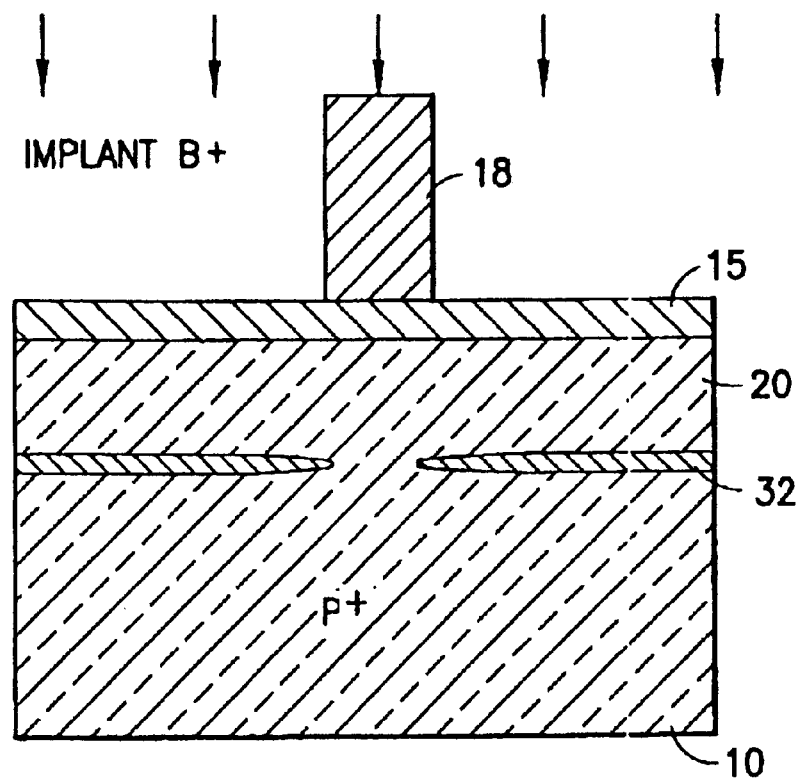
FIGS. 1 through 5 show various stages in the inventive process.

Referring to FIG. 1, there is shown in cross section a portion of an integrated circuit in which p-type substrate 10 has a pad nitride/oxide layer 15 deposited, is patterned with resist 18 over the areas that will become transistor bodies and is then implanted with a dopant species, such as boron or phosphorous to form areas 32 below the transistor body 20 at the prospective source/drain regions of the transistor. The depth of the implant will be set as required by the transistor designer. If a thicker buried layer is desired than results from the natural straggling of the implant, the implant voltage will be varied to produce the desired thickness. The type of the dopant doesn't matter, so long as it makes the silicon easier to etch. Boron can be used to form a $p^+$region and phosphorous to form an $n^+$region.

Figure 2:
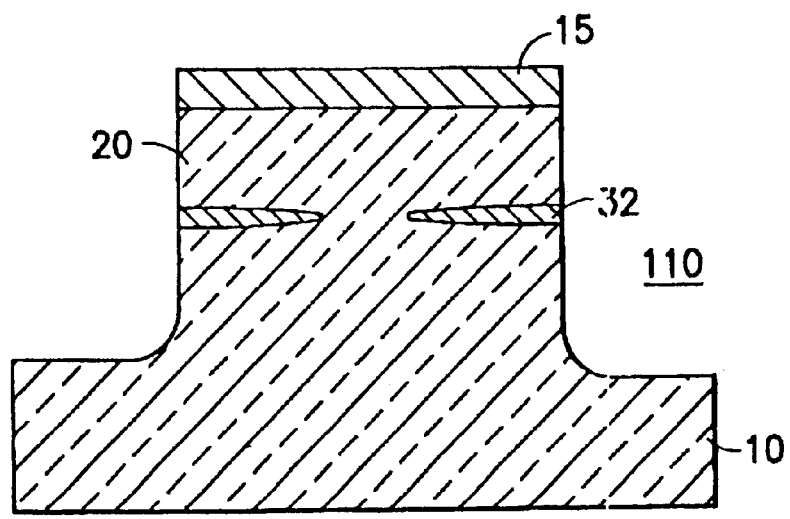

FIG. 2 shows the same area after stripping the resist, patterning a new layer of resist to define the shallow trench isolation (STI) aperture 110 and etching the STI aperture 110 in a-conventional directional reactive ion etch (RIE) process. The edges of the doped areas 32 are now exposed In the wall of the STI aperture 110 and ready to be etched. Those skilled in the art are well aware that STI is formed about a transistor area, extending both in front of and behind the plane of the drawing. The STi thus defines a set of islands in the silicon substrate in which the transistors will be formed.

Figure 3:
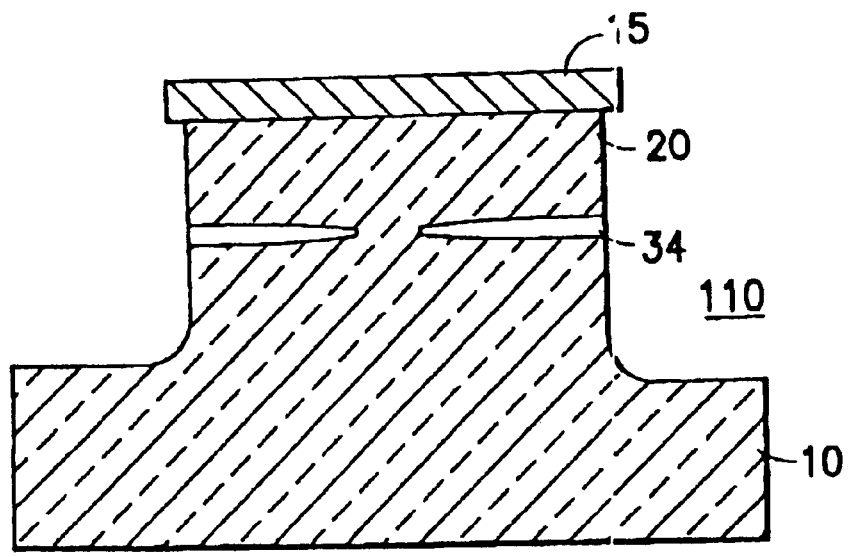

FIG. 3 shows the result of a selective isotropic etch, illustratively HF(49%): $HNO_3$(30%): $CH_3COOH$(100%) (1:3:8 in volume). The (more etch-susceptible) implanted area 34 has been etched while the silicon wall has been etched only slightly.

Figure 4:
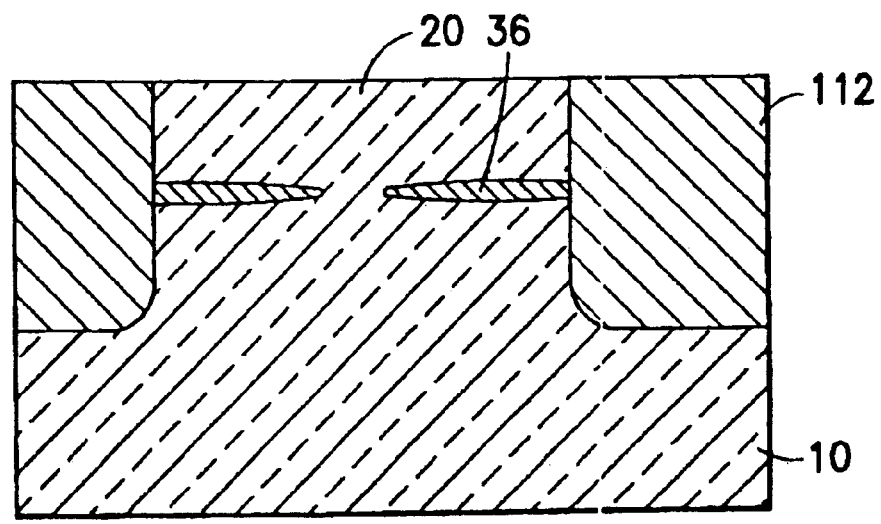

FIG. 4 shows the result of a light thermal oxidation that is required to passivate the walls of the STI (nominally 5 nm thick), followed by a conformal LPCVD oxide deposition (e.g. 500 nm) to fill both the etched regions 36 and the STI aperture 110 with oxide 112 and a chemical-mechanical (CMP) polish to planarize the oxide to either the pad nitride or to the silicon top surface. Advantageously, the light oxidation that is formed on the STI walls anyway exerts minimal stress on the silicon in the transistor body. The oxide deposition does not contribute any stress because there is no volume expansion associated with it. Some voids may be formed in the small cavities, but they will only change the amount of capacitance slightly, within the bounds of ordinary manufacturing tolerances. In any event, voids reduce the capacitive coupling to the substrate.

Figure 5:
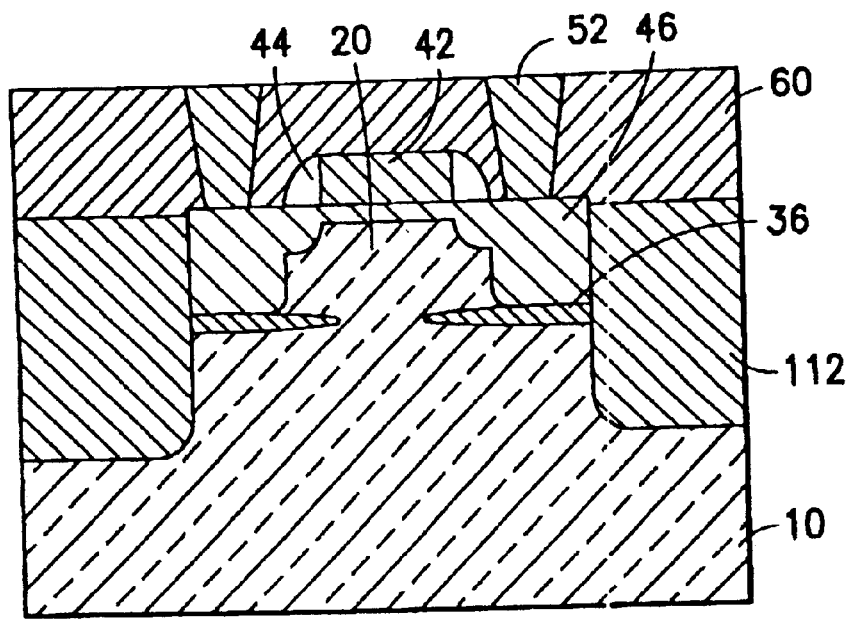

FIG. 5 shows the final transistor with a gate 42 formed over the body 20. Sidewall spacers 44, source-drain 46, first interlayer dielectric 60, and contacts 52 have been formed by conventional processes. In an illustrative process having 120 nm ground rules, the horizontal dimension of the implanted area is >200 nm, the depth of the implant is 250 nm, and the thickness of the area is 70 nm. The implant dose is $1\times10^{16}/cm^2$ of Boron, compared with an illustrative dose of Oxygen of $1\times10^{18}/cm^2$ to form implanted oxide. With a reduction of dose of a factor of 100, there will be less damage in the transistor device layer.

Conventional steps such as blanket threshold adjust implants, well formation, annealing and the like may be performed as is well known in the art, and will be referred to in the claims as "preparing the substrate". The circuit is completed with additional transistors, conventional back end interconnect, aluminum or copper, to form the desired circuit, which will be referred to as "completing the circuit".

Figure 6:
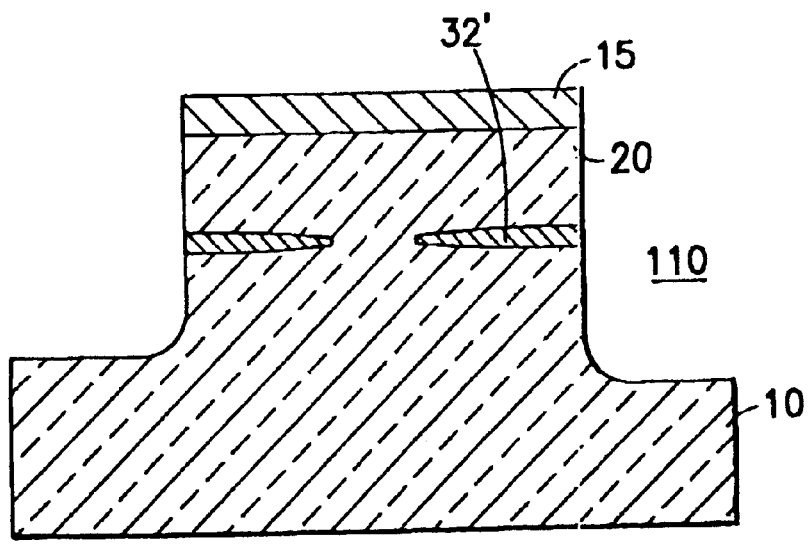
FIGS. 6 through 8 show stages in an alternative process.
Figure 7:
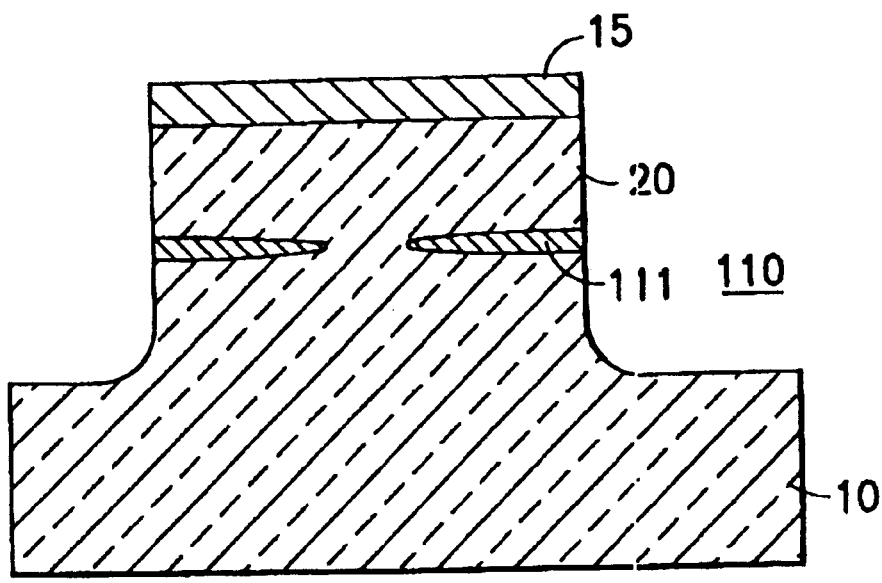
Figure 8:
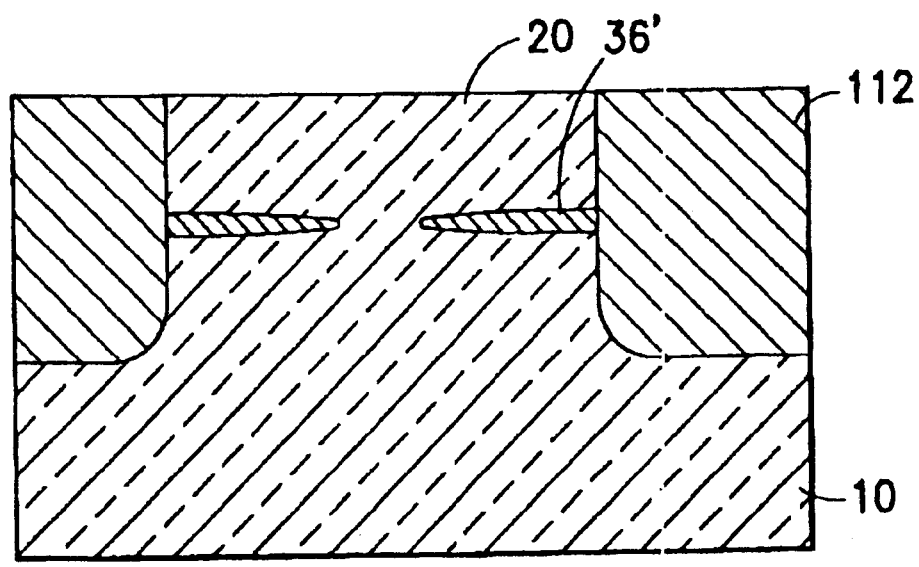

Continuing with FIGS. 6 through 8, there are shown selected steps in an alternative embodiment. In this case, FIG. 6, corresponding to FIG. 2, shows the implantation of areas 32' with Boron ions in a process similar to that of FIG. 1. Illustratively the dose is $1\times10^{16}/cm^2$. The wafer has a blanket implant of H, illustratively $1\times10^{13}/cm^2$, to make it n-type.

FIG. 6 also shows the result of electrolysis in a HF bath. This process forms a region of porous silicon corresponding to the implanted region 32', as described in, e.g. "Porous Silicon techniques for SOI structures", Sylvia S. Tsao, IEEE Circuits and Devices, November 1987, p.3. The oxidation step that oxidizes the STI walls also fills the areas 36' to form an oxide region 111. Advantageously, the electrolysis current and HF concentration in the solution during electrolysis are selected so that the porous silicon regions 32' have a density that is 45% of the bulk silicon. In that case, the expansion upon oxidation just fills the cavity, resulting in a final buried oxide that does not exert stress on the nearby regions. If desired, the porosity could be set lower or higher, so that the buried oxide does exert stress or strain, respectively, on the S/D and body to improve electron mobility in the channel.

Figure 9:
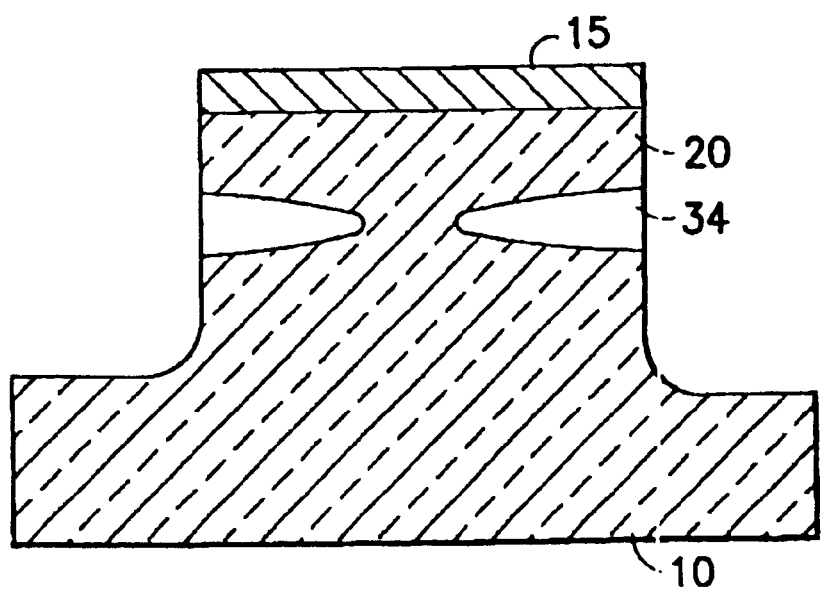
FIG. 9 shows a stage in another alternative process.

Referring now to FIG. 9, there is shown another alternative embodiment of the invention that combines the steps of FIGS. 2 and 3 in a single step with a sequence of etch recipes. In this embodiment, a dry etch using halogen chemistry to first etch vertically the trench and then to etch laterally the heavily doped implanted region. Doped (n-type) silicon can be etched between 1.3 and 30 times faster than undoped or p-type silicon, depending on the dopant species and concentration and the plasma parameters. For example, the initial vertical etch may use $Cl_2$, HBR, $O_2$ and/or He with low process pressure (5–20 mTorr), high RF source power (250W–600W) and high RF bias power of about 50W–200W. After the vertical etch, the doped n-type regions may be etched with the same chemistry and RF source power, but with higher process pressures (20–60 mTorr) and low RF bias power (0W–20W) is used that etches significantly in the horizontal direction (referred to herein as "non-directional"). That has the effect of etching the implanted area in preference to the silicon substrate, thereby eliminating the separate isotropic etch shown in FIG. 3.

While the invention has been described in terms of three embodiments, those skilled in the art will recognize that the invention can be practiced in various versions within the spirit and scope of the following claims. For example, a SiGe or silicon on insulator substrate can be used instead of bulk silicon; the implantation can also be formed under diodes, capacitors, or first level interconnects; and/or the sequence can be changed, with the implantation being formed after the STI etch.

We claim:

1. A method of forming an integrated circuit comprising the steps of:

preparing a semiconductor substrate having a substrate surface;

implanting a set of source/drain areas in said substrate with a dopant species to form a set of buried doped regions;

etching STI apertures about said buried doped regions, thereby defining transistor regions and exposing a surface of said buried doped regions in walls of said STI apertures;

etching said set of buried doped regions in an isotropic etch to form buried cavities;

filling said STI apertures and said buried cavities conformally with an STI insulator;

forming transistors having sources and drains disposed above said buried cavities filled with the STI insulator; and connecting said transistors to form said integrated circuit.

2. A method according to claim 1, in which:
said STI insulator is LPCVD oxide.

3. A method according to claim 2, in which:
said dopant species is Boron.

4. A method according to claim 2, in which:
said dopant species is Phosphorous.

5. A method according to claim 1, in which said step of etching STI apertures and said step of etching said buried doped regions are performed with the same etching chemistry.

6. A method according to claim 5, in which said step of etching STI apertures is performed with halogen-based chemistry, low process pressure and high RF bias power; and said step of etching said buried doped regions is performed with said halogen-based etching chemistry, higher process power and low RF bias power.

7. A method according to claim 6, in which said step of etching STI apertures is performed with chlorine-based chemistry, process pressure in the range from about 5 mTorr to about 20 mTorr and RF bias power in the range from about 50 W to about 200 W; and said step of etching said buried doped regions is performed with said halogen-based etching chemistry, higher process power in the range from about 20 mTorr to about 60 mTorr and low RF bias power in the range from about 0 W to about 20 W.

8. A method of forming an integrated circuit comprising the steps of:

preparing a semiconductor substrate having a substrate surface;

implanting a set of source/drain areas in said substrate with a dopant species to form a set of buried doped regions;

etching STI apertures about said buried doped regions, thereby defining transistor regions and exposing a surface of said buried doped regions in walls of said STI apertures;

forming regions of porous silicon in said buried doped regions by electrolysis;

oxidizing said walls of said STI apertures and said porous material to form buried oxide regions;

filling said STI apertures conformally with an STI insulator;

forming transistors having sources and drains disposed above said buried oxide regions and transistor bodies disposed between said sources and drains; and connecting said transistors to form said integrated circuit.

9. A method according to claim 8, in which:

said regions of porous silicon have a porosity of about 45%, whereby said buried oxide regions exert substantially zero stress on said sources/drains and said transistor bodies.

10. A method according to claim 8, in which:

said regions of porous silicon have a porosity of less than 45%, whereby said buried oxide regions exert stress on said sources/drains and said transistor bodies.

11. A method according to claim 8, in which:

said regions of porous silicon have a porosity of greater than 45%, whereby said buried oxide regions exert strain on said sources/drains and said transistor bodies.

* * * * *